United States Patent [19]

Schweickert

[11] Patent Number: 4,638,248
[45] Date of Patent: Jan. 20, 1987

[54] METHODS AND APPARATUS FOR MEASURING RELATIVE GAIN AND PHASE OF VOLTAGE INPUT SIGNALS VERSUS VOLTAGE OUTPUT SIGNALS

[75] Inventor: Robert K. Schweickert, Colorado Springs, Colo.

[73] Assignee: Massachusetts Institute of Technology, Cambridge, Mass.

[21] Appl. No.: 743,165

[22] Filed: Jun. 10, 1985

[51] Int. Cl.[4] ............................................. G01R 19/00
[52] U.S. Cl. ................................. 324/76 R; 324/83 R; 324/77 B; 364/553
[58] Field of Search ................ 370/29, 62; 179/18 ES, 179/2 DP; 364/553, 571; 324/58 A, 73 R, 73 AT, 76 R, 77 R, 77 A, 77 B, 79 R, 79 D, 83 R, 83 A, 83 D, 121 R

[56] References Cited

U.S. PATENT DOCUMENTS

| | | | |
|---|---|---|---|
| 3,636,448 | 1/1972 | Nihashi et al. | 324/140 |
| 3,665,304 | 5/1972 | Mayback | 324/85 |
| 3,813,672 | 5/1974 | Weisser | 343/113 R |
| 3,930,147 | 12/1975 | Bellanger | 324/77 H |
| 4,134,072 | 1/1979 | Bolger | 324/83 D |
| 4,307,340 | 12/1981 | Inami | 324/121 R |
| 4,423,371 | 12/1983 | Senturia et al. | 324/61 R |
| 4,484,291 | 11/1984 | Schlosser | 324/78 Z |
| 4,492,917 | 1/1985 | Inami | 324/77 A |

OTHER PUBLICATIONS

"A Wireless Computer Based Gain-Phase Meter with Application to Dielectric Sensing," R. K. Schweickert (M.I.T. 9/83).

Primary Examiner—Michael J. Tokar
Attorney, Agent, or Firm—Hamilton, Brook, Smith & Reynolds

[57] ABSTRACT

A system for accurately measuring frequency response (phase and gain) in either a wireless or in a wired mode of operation is described. When used in either mode, a multiplexing method is employed which allows the use of a narrow channel bandwidth, with a simultaneous improvement in overall accuracy. Cancellation of all linear and time invariant errors, including those of the analog to digital conversion process, is thus accomplished. As a result, the system error only depends on the differential nonlinearity of the channel.

10 Claims, 7 Drawing Figures

```
At  1KHz    Mag(dbV)= -56.794  Phase= -89.317  Offset=  .135  Gain=100
At  100Hz   Mag(dbV)= -36.898  Phase= -89.077  Offset=  .138  Gain= 10
At  10Hz    Mag(dbV)= -16.996  Phase= -81.843  Offset=  .139  Gain=  1
At  1Hz     Mag(dbV)=  -1.735  Phase= -34.996  Offset=  .140  Gain=  1↑C
A>picture screen.pic
```

|←——— $V_{IN}$ Part of $V_{MUX}$ ———*——— $V_{OUT}$ Part of $V_{MUX}$ ———→|

METHODS AND APPARATUS FOR MEASURING RELATIVE GAIN AND PHASE OF VOLTAGE INPUT SIGNALS VERSUS VOLTAGE OUTPUT SIGNALS

The government has rights in this invention pursuant to Contract No. N00014-78-C-0591 awarded by the Department of Navy.

DESCRIPTION

1. Technical Field

This invention relates to signal measuring equipment. More specifically, this invention relates to apparatus for measuring the ratio of the amplitude of an input voltage signal into a circuit versus the amplitude of the output signal from the circuit to determine the gain of the circuit and the degree of phase shift imposed by the circuit on the input signal to determine relative phase shift.

2. Background Art

It is often desirable to measure the relative gain and phase of two electrical signals over a range of frequencies. One application for such a measurement occurs in microdielectrometry.

A microdielectrometer is a sensor which measures dielectric constants of test material. Such a sensor is described in U.S. Pat. No. 4,423,371. The sensor comprises a semiconductor chip containing a Charge-Flow-Transistor (CFT) and a Field-Effect-Transistor (FET). The sensor chip is buried in the test material. The CFT and the FET are matched devices, except for the metal pattern making up the sensing electrode fingers on the CFT.

The gate electrode of the CFT is driven by an input voltage or "driven gate" voltage ($V_{DG}$) and the output voltage $V_{FG}$ is taken from the "floating gate" electrode of the FET.

As long as the CFT and FET have well matched transistor properties, the frequency response from the input, $V_{DG}$, to the output, $V_{FG}$, of the feedback circuitry will be closely related to the frequency response of the material covering the interdigited electrodes of the CFT. From prior knowledge of the capacitance from the floating gate to ground of the CFT, the frequency response, and hence the real and imaginary parts of the dielectric constant of the material covering the CFT can be determined.

The primary measurement required to determine the dielectric constant consists of very accurately measuring, at various frequencies, the phase shift [$<V_{FG} - <V_{DG}$] and the magnitude of attenuation, i.e., Mag(dbV)[$V_{FG}$]−Mag(dbV)[$V_{DG}$].

Prior art techniques for making this measurement have used a Hewlett Packard HP3575A Gain-Phase meter. The HP3575A meter instrumentation adapts a simple approach to measure the relative gain and relative phase of two signals. The phase is measured by first amplitude limiting the signals to produce square waves from the sinusoidal signals under test. Exclusive OR Gate circuitry is then used to provide a DC output; the level of which is proportional to the relative locations of the zero crossings of the signals. This technique, although simple, has several drawbacks affecting phase accuracy, the three most predominant ones being:

(1) Since there are *two* measurement channels, the two channels must be periodically calibrated so that the PHASE characteristics match each other;

(2) DC offsets inherent in the signal paths tend to destroy phase accuracy; and (3) if non-sinusoidal periodic waveforms are applied at the input ports, harmonics in the signals produce erroneous results because the instrument operates only on the zero crossings of the signal and does not resolve the signals into their spectral components.

For *gain* measurement, the HP3575A uses logrithmic amplifiers to produce an output proportional to the relative gain in decibels of the two signals. The most predominant errors associated with this type of relative gain measuring system are similar to those associated with PHASE measurement:

(1) Since there are two measurement channels, the two channels must be periodically calibrated so that the GAIN characteristics match each other;

(2) DC offsets inherent in the logrithmic amplifiers tend to destroy gain accuracy; and (3) if non-sinusoidal waveforms are applied at the inputs, harmonics in the signals confuse the instrument into producing erroneous results. This occurs since the system cannot resolve its inputs into their spectral components.

Accordingly, a need exists for a device which will accurately measure the relative gain and phase of the two voltage signals and which eliminates the introduction of linear errors by the measuring device itself and also provides a very narrow channel bandwidth in the measuring device.

DISCLOSURE OF THE INVENTION

In accordance with the invention, relative gain and phase measurement of two signals is accomplished by first multiplexing the two signals and sequentially coupling the two signals to be measured into a single measurement channel. In this manner, no linear errors are introduced into the measurement since both signals experience the same attenuation and phase shift in passing through the finite bandwidth of the common measurement channel. This also permits a narrow bandwidth channel to be used, without introducing linear errors, thereby providing an increase in signal-to-noise ratio.

Linear errors are not introduced since the relative magnitude or ratio of $V_{OUT}/V_{IN}$ (or more generally, $V2/V1$) and relative phase $<V2/V1$ are being measured, thus, the magnitude and phase of the measuring channel's frequency response is cancelled out of the measurement. Furthermore, the invention measures relative gain and phase after first calculating the signal's Fourier Series Coefficients. Thus, since the invention first resolves the signals into their spectral components, non-sinusoidal periodic waveforms can be measured with no degradation in accuracy.

To take advantage of the common channel measurement, the input signals are Time-Division-Multiplexed (TDM) into the measurement channel. Since portions of the waveforms are coupled into the channel at different times, the two signals are first demultiplexed and then reconstructed at the output of the common measurement channel. This inherently requires the use of memory, which in turn leads to the use of digital signal processing techniques, because of the accuracy thereof and advanced state of digital memory.

Thus, the TDM signals are synchronously converted from Analog to Digital from the output of the measurement channel to allow the TDM waveform to be stored in memory and to be operated on by a digital signal processor or computer. The digital signal processor first demultiplexes the TDM waveform and then reconstructs the two waveforms into separate 'input' and 'output' waveforms. The input and output waveforms are then resolved into their desired spectral components by calculation of the signal's complex Fourier Series Coefficients. The relative Gain and Phase of the first coefficients, representing the fundamental frequency component of the input signals, is then computed with the result being transmitted to an output device, such as a printer, CRT, or similar device. This resultant output is the relative Gain and Phase of the input signals at their common fundamental frequency.

A specific embodiment of the common channel gain and phase meter will be described which is directed to microdielectrometer applications and particularly to an optional wireless dielectric phase/gain sensing system, but this should not be taken as limiting the general application of the device to a wireless system or to a dielectric constant measurement.

BEST MODE OF CARRYING OUT THE INVENTION

I. Generalized System Description

Figure 1:
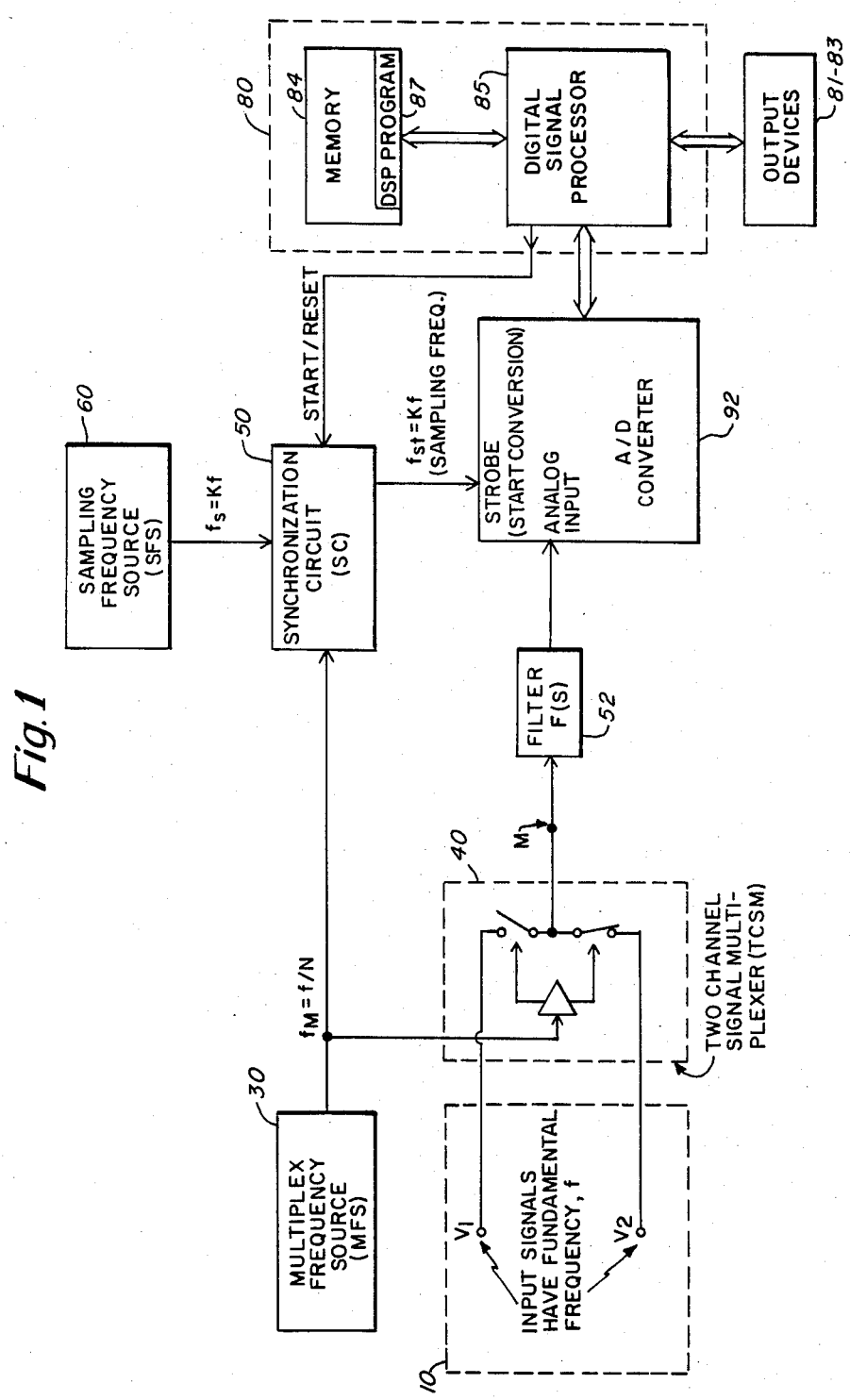
FIG. 1 is a block diagram of a generalized common channel gain phase meter of the invention.

An overview of the Common Channel Gain Phase Meter of the invention will now be given in connection with FIG. 1. The purpose of this system is to very accurately measure the relative gain and phase of the two input signals, V1 and V2, shown in block 10.

The Common Channel Gain Phase Meter accomplishes this by allowing both input signals to share a single measurement channel (hence its name). As can be seen from FIG. 1, no linear errors will be introduced into the measurement, since both input signals experience the same attenuation and phase shift in passing through the finite bandwidth of the measurement channel. Since the relative Magnitude, $|V2/V1|$, and the relative Phase, $<V2/V1$, are measured, the Magnitude and Phase of the channel's frequency response effectly drops out of the measurement, and hence the channel adds no linear errors.

Since the input signals are sent through the same measurement channel at different times, the system inherently requires the use of some memory. In addition, digital signal processing techniques allow direct computation of the input signal's complex Fourier Series coefficients from their samples. Digital signal processing is therefore advantageous and even necessary in lieu of the above-mentioned memory requirement.

Some of the advantages of the Common Channel Gain Phase Meter are (refer to FIG. 1):

1. A narrow bandwidth linear filter 52 may be inserted into the common measurement channel without introducing any linear errors. This increases the signal-to-noise ratio present at the input to the A/D converter 92 allowing a larger dynamic range for the measurement.
2. In a similar fashion, the delay and aperture time of the A/D converter 92 does not introduce linear errors into the measurement.
3. The digital signal processor 85 allows Fourier Analysis to be performed on the input signals. This allows harmonics to be present in the input signals without introducing error into the gain-phase measurement at the fundamental frequency (provided aliasing is prevented through the judicious choice of filter bandwidth and sampling frequency).

Table 1 below describes the elements which form the Common Channel Gain Phase Meter and indicates in Column 3 state-of-the-art devices for implementing the elements.

TABLE 1

| (1) Elements | (2) Function(s) | (3) Implementation |
| --- | --- | --- |
| Two-Channel Signal Multiplexer (TCSM) (40) | To Multiplex signals V1, V2 to point M. | CMOS Analog Switches |
| Multiplex Frequency Source ($f_m = f/N$) (30) | To provide a frequency $f_m = f/N$ which is an even integer multiple or submultiple of the fundamental frequency of either V1 or V2. Frequency $f_m$ is used as the reference clock of the multiplexer to control the multiplexing rate. With N an even integer, N/2 cycles of V1 followed by N/2 cycles of V2, and so on, is present at M. Also used as an input to the synchronization circuit to provide information as to which input signal is present at M. | Divide by N counter driven by V1 (N is an even integer), producing $f_m = f/N$. |
| A/D Converter (92) | Analog to Digital Conversion. To digitize the multiplexed analog signal present at the output of the filter F(S) 52. | Data Acquisition System. |
| Sampling Frequency Source ($f_s = Kf$) (SFS) (60) | To provide a frequency $f_s = Kf$ which is an integer (K) multiple of the fundamental frequency of either V1 or V2. Frequency $f_s$ is used as the reference clock of the A/D to control the sampling frequency so that K samples per cycle of both input signals can be taken | Phase Lock Loop used as a frequency multiplier, driven by V1. |
| Synchronization Circuits (SC) (50) | To gate the A/D strobing signal, $f_{st} = Kf$, ON or OFF as appropriate. After receiving a START command, the synchronization circuit waits for the appropriate instant (as determined from the MFS), to gate on $f_{st}$ and allow sampling to begin. This makes it possible for the Digital Processor 85 at a later time to demultiplex the signals stored in memory. | Flip-Flop with an AND gate |

TABLE 1-continued

| (1) Elements | (2) Function(s) | (3) Implementation |
| --- | --- | --- |
| Memory (84) | Store all the signal samples which come out of the A/D converter and to store the program required for the Digital Signal Processor. | |
| Digital Signal Processor (85) | 1. Initiate Synchronization Circuit with a START bit.<br>2. Shuffle digital output of A/D into proper memory locations as the samples are taken.<br>3. RESET Synchronization Circuit after sampling is complete.<br>4. After sampling is complete, demultiplex and reconstruct the digital signals thus stored in memory into two separate signals corresponding to inputs V1 and V2.<br>5. Perform spectral analysis on each signal stored in memory using digital signal processing techniques, and find their relative gain(s) and phase(s) at the desired spectral component(s).<br>6. Output the results. | COMPUTER |
| Output Device (81–83) | Display results of the DSP calculations | Video Display terminal. |
| DSP Program (87) | The set of instructions required by the Digital Signal Processor. | |
| Filter (F(S) (52) | Reduce amplitude of high-order harmonics, which may be present in signals V1 and V2. This prevents errors associated with aliasing. Also, to reduce the bandwidth of the Common Channel in order to improve the signal to noise ratio and hence the dynamic range of the measurement. The narrower the bandwidth of F(S), the slower the multiplexing rate $f_m$ must be made to allow F(S) to settle properly before measuring its output. | Bessel Filter |

A detailed description of the individual elements as implemented in a specific embodiment now follows in connection with FIGS. 1–5 wherein numeral designations in FIG. 1 have been retained for corresponding elements.

II. Multiplexing Test Signal Generator and Two Channel Signal Multiplexer

Figure 2:
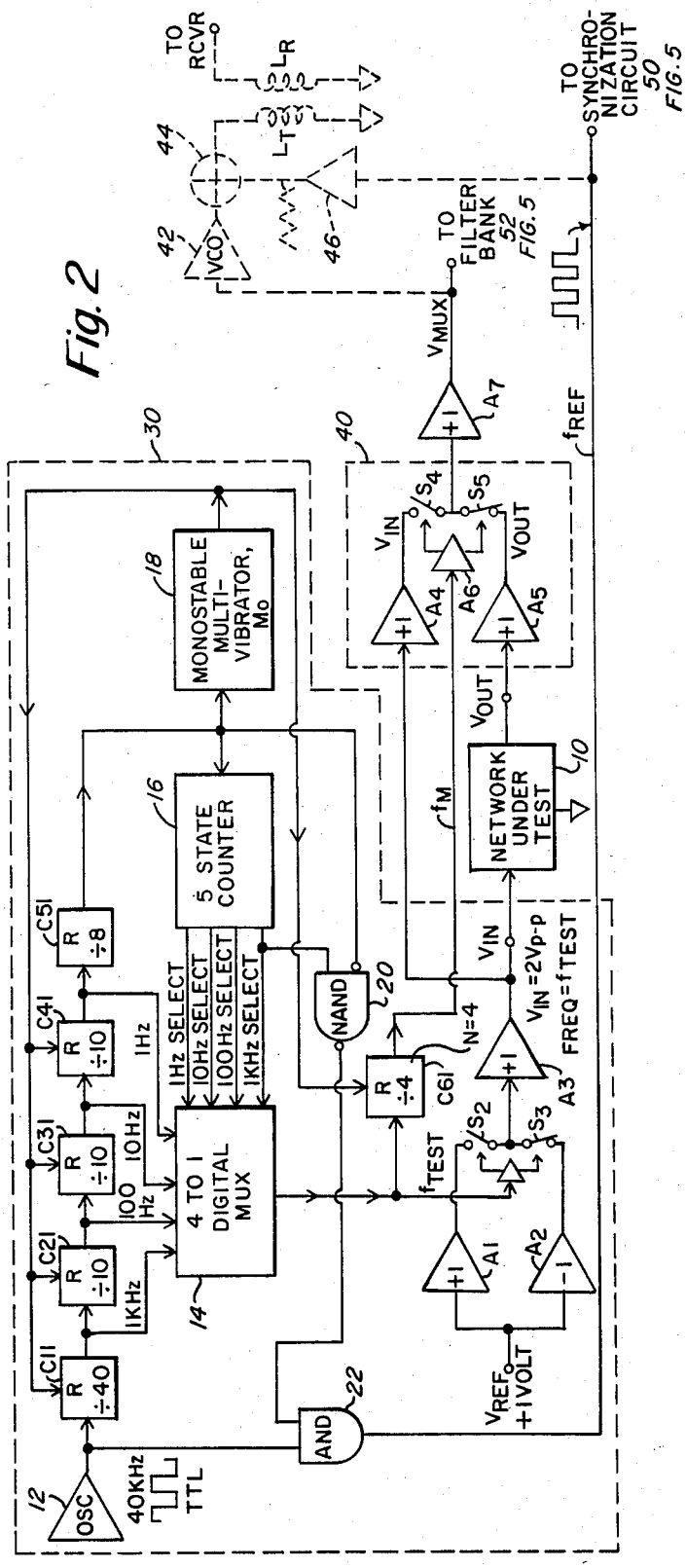
FIG. 2 is a block diagram of the multiplexing test signal generator 30 and two channel signal multiplexer of the invention.
Figure 3:
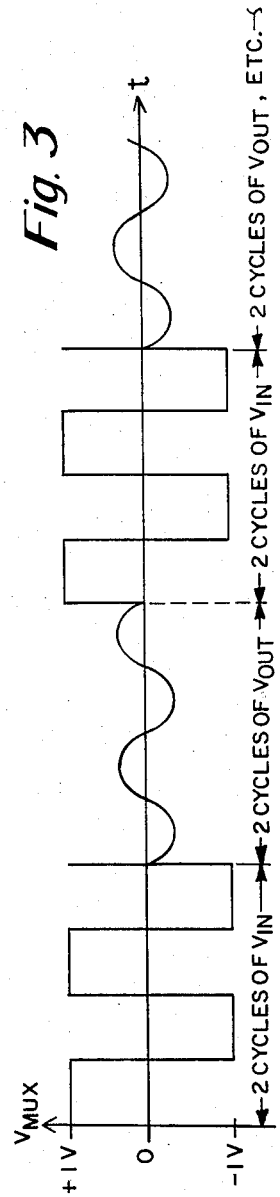
FIG. 3 is a plot of voltage versus time of the output of the two channel signal multiplexer of the invention, assuming an arbitrary Network Under Test.
Figure 4:
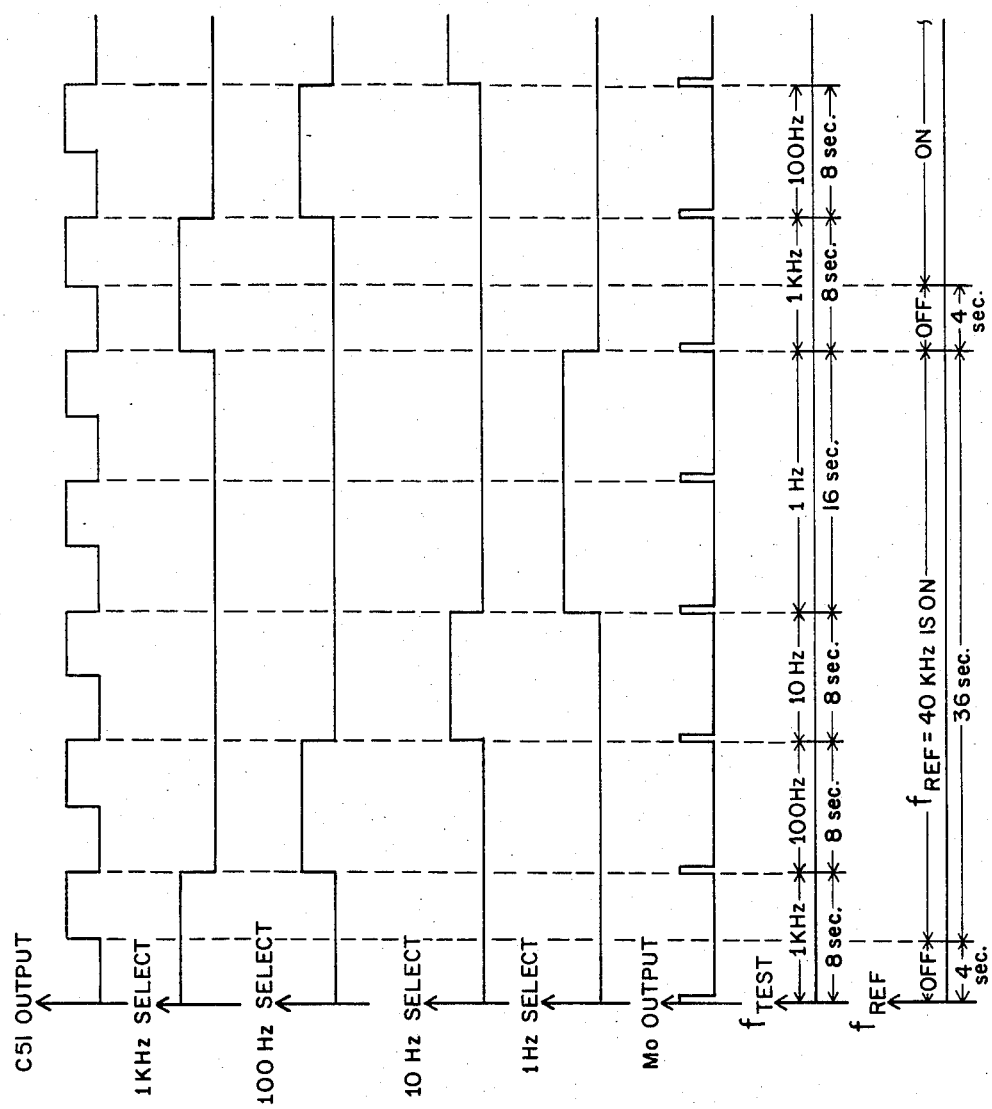
FIG. 4 is a timing diagram illustrating the counter voltage pulses produced by the test signal generator.

Referring now to FIGS. 2, 3 and 4, the details of the multiplexing test signal generator 30 and the two channel signal multiplexer (TCSM) 40 will be explained.

The function of the multiplexing test signal generator 30 is to provide a reference frequency $f_M$ which equals f/N and which is an even integer submultiple N of the fundamental frequency "f" of either the voltage in ($V_{IN}$) or the voltage out ($V_{OUT}$) of the Network Under Test 10. The frequency signal $f_M$ is used as the reference clock of the multiplexer to control the multiplexing rate. With N an even integer; N/2 cycles of $V_{IN}$ followed by N/2 cycles of $V_{OUT}$ will be present at the output of the TCSM 40.

This sequence is shown in FIG. 3. FIG. 3 is a plot of voltage vs. time at the output of the TCSM 40 with an arbitrary Network Under Test (10) plugged into the unit. This sequence continues for 8 seconds for each of the test frequencies of 1 kHz, 100 Hz, 10 Hz and for 16 seconds for the test frequency $F_{test}$ equal to 1 Hz. The process continually repeats. The purpose of utilizing multiple frequencies is to accurately measure the relative gain and phase caused by the Network Under Test 10 between the $V_{IN}$ and $V_{OUT}$ of the Network Under Test at each of four test frequencies.

Referring to the timing diagram of FIG. 4, it should be noted that a complete measurement cycle is 40 seconds long and that the reference frequency, $F_{REF}$, is shut off for the first 4 seconds of each cycle. A synchronization circuit 50 in the receiver, FIG. 5, detects the absence of the reference frequency and gates the reference frequency into the STC System Timing Controller (60), FIG. 5 beginning with the first pulse after the Off period.

The function of the two-channel signal multiplexer 40 is to multiplex the signals $V_{IN}$ and $V_{OUT}$ to a filter bank 52 located at the receiver. An astable multivibrator-type oscillator 12 is used to generate a 40 kHz reference frequency $F_{REF}$ from which all lower frequencies are derived. The squarewave output of oscillator 12 is fed into a string of cascaded counters, C11, C21, C31, C41 and C51, which divide the reference frequency of 40 kHz into the respective 1 kHz, 100 Hz, 10 Hz and 1 Hz test frequencies.

Counter C51 divides the 1 Hz frequency by 8 to generate a 0.125 Hz frequency signal which is NANDED with the output of a 5 state counter 16 to select the appropriate frequency every 8 seconds except for the 1 Hz signal which is selected for 16 seconds (as shown in FIG. 4) to be applied to a 4 to 1 digital multiplexer 14 and then to be applied as the test frequency signal $V_{IN}$ to the Network Under Test 10.

At the instant that a particular frequency is selected, monostable multivibrator 18 resets the appropriate counters with a narrow pulse. This insures that counter $C_{61}$ starts each cycle with switch S4 closed and switch S5 opened. Counter $C_{61}$ then toggles switches S4 and S5, alternately closing the switches in turn for two cycles each of the applied frequency.

A reference voltage $V_{REF}$ of one volt acts as a bias voltage to amplifiers A1 and A2 and switches S2 and S3 to produce a nearly zero mean squarewave of the applied frequency at the input to amplifier A3. In this manner, the amplitude of the input signal, $V_{IN}$ is made equal to the voltage reference signal, which is approximately one volt. Note that, while signal amplitude is not critical, amplitudes larger than about 1 volt may result in non-linear effects in the Network Under Test. Amplifier A3 is a small bandwidth low power amplifier which is slew-limited to about 0.005 volts per microsecond. This reduces the rise time of the signal before it is applied to the Network Under Test 10 yielding approximately an extra 20 db of attenuation at the 19 kHz harmonic when the 1 kHz signal is applied. Substantial reduction in errors due to aliasing are thus realized when sampling the 1 kHz signal at a rate of 20 kHz.

The voltage $V_{IN}$ to the Network Under Test 10 is applied to buffer A4 in TCSM 40 while the voltage $V_{OUT}$ is applied to buffer A5 in TCSM 40. Buffers A4 and A5 are matched. Buffer amplifier A4 is used to help cancel phase error and is only required if a bandwidth of greater than 5 megahertz cannot be achieved with buffer A5.

The outputs of amplifiers A4 and A5 are multiplexed via switches S4 and S5. Switches S4 and S5 are enabled by the switch driver A6. The input to switch driver A6 is the multiplex frequency signal, $fm = f_{TEST}/4$, via 4/1 counter C61. Switches S2, S3, S4 and S5 may comprise well-known CMOS analog switches. When switches S4 and S5 are toggled, the signal at the input to buffer A7 experiences a fast rise time depending on the relative magnitude and phase of the outputs of buffers A4 and A5. The purpose of buffer A7 is to limit the maximum rate of change of the signal output $V_{MUX}$ at the VCO input (FIG. 2) to about ±0.5 volts per microsecond. This prevents loss of phase lock from occurring in the receiver's phase lock loop demodulator when the switches S4 and S5 are toggled. The slew-limiting feature of A7 is only required in the wireless mode of operation.

A slew rate of 0.5 volts per microsecond is about 100 times faster than the maximum rate of change of the signals at the output of A4 and A5; therefore, A7 is able to pass these signals with virtually no slewing-induced distortion, allowing accuracy to be maintained. The output signal $V_{MUX}$ to filter bank 52 may be connected by wire or transmitted by wireless. Therefore, an optional VCO (Voltage Controlled Oscillator) 42 is shown in dotted lines at the output of amplifier buffer A7.

In addition, in the wireless mode, a 40 kHz triangle wave is generated by filtering $f_{REF}$ with network 46. The triangle wave and VCO output are summed via summer 44. This sum is then transmitted wirelessly (in the optional wireless mode) via the transmitting coil $L_T$ fields. $F_{REF}$ must first be filtered by network 46 to prevent the spectra of $f_{REF}$ from interferring with the 2.5 MHz center frequency at the output of the VCO 42. One way of generating the triangle wave is to send the squarewave output through a slew-limiting device, such as an operational amplifier 46.

The summation of the VCO output signal from voltage controlled oscillator 42 with the 40 kHz triangle wave 46 in summer 44 is performed linearly to prevent possible intermodulation distortion products from appearing in the 40 kHz region of the spectrum. This enables a clean 40 kHz signal to be obtained at the receiver, such that neither the amplitude nor the period is modulated by the voltage control oscillator's output frequency. Such a situation could cause significant errors during sampling, since the sampling period is derived from the 40 kHz signal. A simple resistor network is used for summing and an NPN transistor (not shown) is used to drive the transmitting coil $L_T$.

Utilizing the optional wireless mode of operation, the output of summer 44 is transmitted via the field of coil $L_T$ fields. This field is converted back into a current via the receiving coil $L_R$. The current thus generated in coil $L_R$ contains sufficient information to reconstruct the two signal $V_{MUX}$ and $f_{REF}$ in the receiver. Using the system in the optional wireless mode eliminates all wires between the circuit of FIG. 2 and the receiver (shown in FIG. 5).

In the case of cure monitoring utilizing microdielectrometry, the complete circuit of FIG. 2 may be built as an integrated circuit sensor and embedded into the material under investigation. The material would thus form the Network Under Test shown as 10 in FIG. 5. In the wireless mode of operation, then, the wires otherwise connecting the embedded integrated circuit sensor with the rest of the system may thus be eliminated. This is particularly desirable in the case of in-situ cure monitoring, since the wires otherwise connecting to the embedded IC could become tangled up during the production of structures formed from composite materials.

It should be understood that an additional pair of coils may be embedded with the sensor to inductively couple external RF energy, to the sensor to provide for the sensor chip circuit shown in FIG. 2. It is estimated that about 30 to 40 milliwatts would be required to power the chip. Alternatively, a sufficiently thin battery capable of supplying the requisite power would be required. If the power is inductively coupled to the chip at 40 kHz, the on-chip oscillator may be eliminated and the 40 kHz power voltage used also as the frequency source.

III. Demultiplexing Sensor Processor

The receiver circuitry utilized in connection with the invention will now be described in connection with FIG. 5 which is a block diagram of the demultiplexing and signal processing apparatus of the invention.

Figure 5:
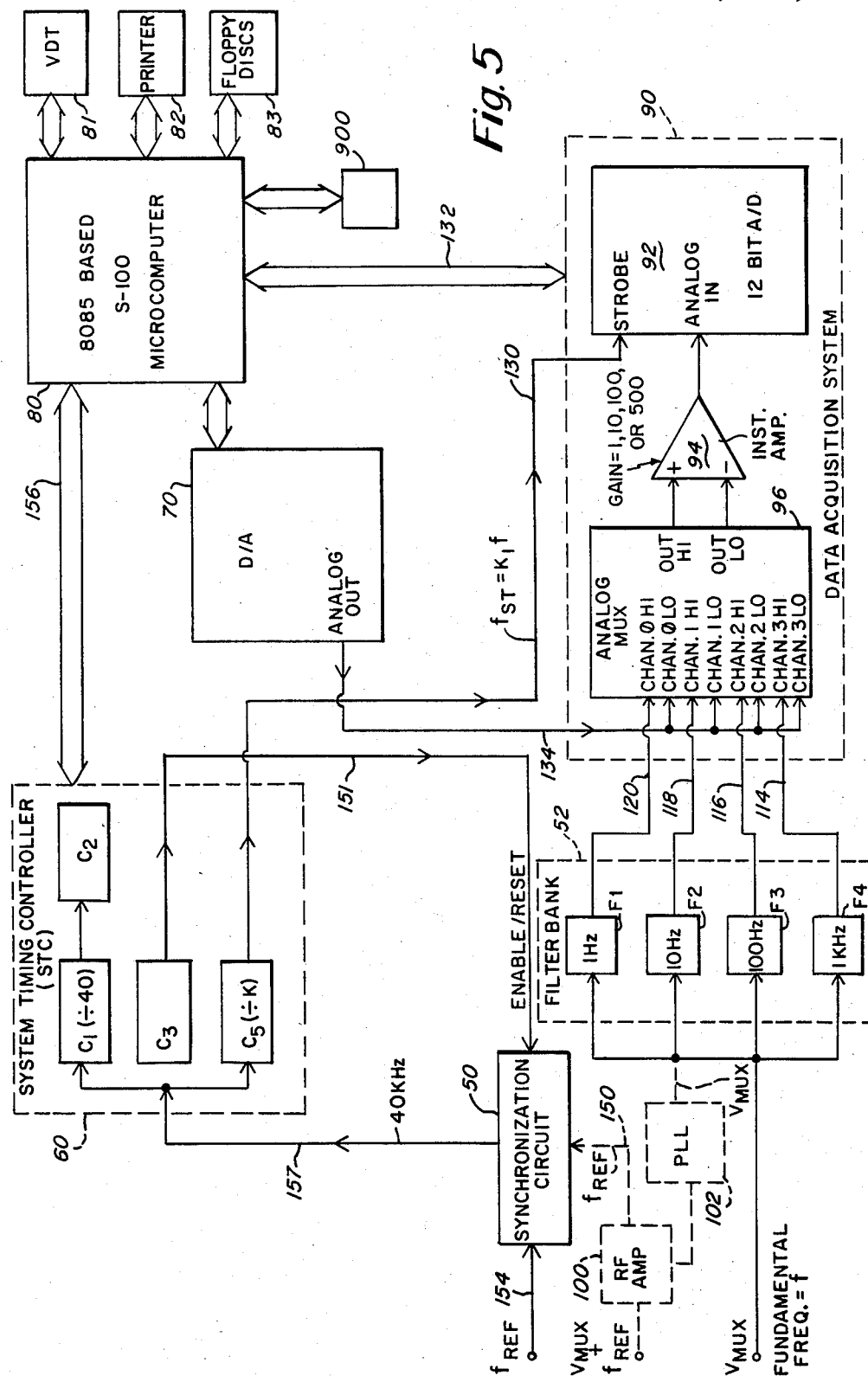
FIG. 5 is a block diagram of the Data Acquisition System, Computer and Filter Bank used for Digitizing and Digital Signal Processing of the signal $V_{MUX}$.

In the apparatus of FIG. 5, synchronizing circuits 50 are provided to gate the reference frequency $f_{REF}$ to the STC 60 beginning with the first pulse after the 4 second OFF period, and after the synchronization circuits Enable/Reset line 151 is brought high. The Enable/Reset line is brought to a logic high state by counter C3 on the STC 60, after the computer is given the command from the keyboard 900. After receiving a start command from the keyboard, the output of counter C3 on line 151 is set to a logic high state under program control. The synchronization circuit (50) then feeds $f_{REF}$ to the STC 60 beginning with the first $f_{REF}$ pulse following the 4 second off period in the $f_{REF}$ signal (See $f_{REF}$ in FIG. 4).

Counters C1 and C2 on the STC 60 then count the signal $f_{REF}$ beginning with the first $f_{REF}$ pulse fed to the input of the STC. The computer 80 then continually interrogates counter C2 for the proper count at which to begin. When the proper count is reached, counter C5 is loaded under software control with the appropriate integer K. The output of counter C5 on line 130 is used to strobe the A/D converter 92 at the frequency $f_{ST} = f_{REF} \div k = k_1 f$. Thereby, counter C5 (under program control) is used to control the number of samples per cycle which are taken at each of the four input frequencies. For example, when the $V_{MUX}$ input frequency $f = 1$ kHz, 20 samples/cycle are taken. This requires $f_{ST} = 20$ kHz, so $K_1 = 20$ and therefore counter C5 is programmed under software control to divide $f_{REF}$ by $K = 2$. Likewise, after the sampling and calculations are complete for the 1 kHz $V_{MUX}$, the program resumes the interrogation of C2 for the proper count at which to begin sampling the 100 Hz $V_{MUX}$. When that new count is reached (based on counting $f_{REF}$ pulses), C5 is again loaded with the integer $K = 2$ just prior to sampling the 100 Hz $V_{MUX}$ waveform. This value of $K = 2$ allows 200 samples/cycle to be taken of the 100 Hz $V_{MUX}$ signal. Now after the sampling and calculations are complete for the 100 Hz $V_{MUX}$, and after C2 reaches the correct count, the integer $k = 10$ is loaded into C5 just prior to sampling the 10 Hz $V_{MUX}$. This makes $f_{ST} = 4$ kHz so that 400 samples per cycle are taken of the 10 Hz $V_{MUX}$. Similarly, a value of $k = 100$ makes $f_{ST} = 400$ Hz so that 400 samples/cycle are taken of the 1 Hz signal. Counters C1 and C2 in conjunction with synchronization circuit 50, are thereby used to let the computer and software know exactly where the Multiplexing Test Signal Generator (FIG. 2) is in its test cycle. Due to this synchronization, the computer is able to keep track of the samples and can later determine which samples belong to the $V_{IN}$ part of $V_{MUX}$ and which belong to the $V_{OUT}$ part of $V_{MUX}$. Thereby the computer is able to demultiplex the $V_{MUX}$ waveform into separate $V_{OUT}$ and $V_{IN}$ digital signals.

The memory 84 and the digital signal processor 85 is provided by a microcomputer 80 which in this embodiment comprises an 8085 based S-100 microcomputer. The memory in the microcomputer stores all the signal samples received from the A-D converter 92 and stores the program required for digital signal processing within the microcomputer.

Under program control, the digital signal processor performs the following functions:

(1) initiates synchronization circuit 50 with a start bit by first setting the output of counter C3 high;

(2) selects the appropriate analog MUX 96 channel depending on which frequency is applied;

(3) sets the D/A 70 output to zero volts;

(4) interrogates counter C2 60 for the proper count at which to begin "rough cut" sampling;

(5) loads counter C5 60 with an appropriate integer K in order to take at *most* 100 samples/cycle during "rough cut" sampling and begins sampling using an inst amp. 94 gain setting of unity;

(6) calculates DC offset and amplitude of response signal using just one response signal period, and from this measurement determines the inst. amp. 94 gain and D/A 70 input number to use when sampling "real" data;

(7) loads the input number calculates in (6) above into D/A so that the output of D/A 70 compensates for any offset which may be present;

(8) interrogates C2 60 for the proper count at which to begin real data sampling;

(9) loads counter C5 60 with an appropriate integer K to take the desired number of samples/cycle during real data sampling. Begins sampling, but this time change inst. amp. 94 gain to either 1, 10 or 100 (for during just the $V_{OUT}$ parts of $V_{MUX}$;

(10) after sampling is complete at the applied frequency $V_{MUX}$, demultiplexes $V_{MUX}$ into separate $V_{IN}$ and $V_{OUT}$ digital signals;

(11) performs spectral analysis on the $V_{IN}$ and $V_{OUT}$ digital signals using digital signal processing techniques, and finds their relative gains and phases at the desired spectral components;

(12) outputs the results to output devices, such as the video data terminal 81, printer 82, or a floppy disc 83;

(13) after results are outputted, immediately goes back to step (2) and repeats steps 2-12 for the next applied frequency. Repeats steps 2-12 for all four frequencies applied in a measurement cycle (which lasts 40 seconds) by the circuit in FIG. 2.

The reference frequency signal $f_{REF}$ is provided at the input terminal to the synchronization circuit 50, from gate 22 of FIG. 2.

In the optional wireless mode, the summer 44 (FIG. 2) output received by receiving coil $L_R$ is coupled to the input of RF amplifier 100 (FIG. 5). The RF amplifier amplifies the received signal and separates the signal into two signals, namely the $f_{REF}$ signal and the FM signal, which was modulated by the $V_{MUX}$ signal by voltage controlled oscillator 42 (FIG. 2). The amplified $f_{REF}$ signal at the output of RF amplifier 100 is fed to the synchronization circuit 50. The amplified FM signal at the output of the RF amplifier is coupled to the input of the Phase Lock Loop (PLL) demodulator 102. The demodulated output of the PLL 102 is again the signal $V_{MUX}$ which is then passed to a set of four filters F1-F4 in filter bank 52. The filters reduce the undesirable effects of aliasing and noise.

Since the gain-phase measurement includes measurements of different frequency waveforms ranging over 4 decades, one filter is incorporated for each of the 4 frequencies, i.e., 1 Hz, 10 Hz, 100 Hz, and 1 kHz. In addition to narrowing the noise bandwidth, each filter attenuates harmonics in the demodulated signal reducing the sampling speed and the amount of memory required to avoid aliasing. Each filter must have a bandwidth and order commensurate with the signal multiplexing speed and must attenuate higher frequency components in the signal appropriately, to reduce aliasing.

The important characteristics of each filter, along with the maximum error that would be encountered due to aliasing, are given in Tables 2 and 3 below.

TABLE 2

| Test Frequency | Settling Time to 0.005%, ms | $f_n = w_n/2\pi$ |
|---|---|---|
| 1 kHz | 0.74 | 2.5 kHz |
| 100 Hz | 2.1 | 866 Hz |
| 10 Hz | 21 | 86.6 Hz |
| 1 Hz | 210 | 8.6 Hz |

TABLE 3

| Test Freq | Sampling** Rate | Alias Freq | Filter Atten at Alias Freq db | Max Error due to Aliasing* Mag, db | Phase |
|---|---|---|---|---|---|
| 1 kHz | 20 kHz | 19 kHz | 35 | 0.015 | 0.1° |
| 100 Hz | 20 kHz | 19.9 kHz | 54 | 0.002 | 0.01° |
| 10 Hz | 4 kHz | 3.99 kHz | 67 | 0.002 | 0.01° |
| 1 Hz | 400 Hz | 399 Hz | 67 | 0.004 | 0.02° |

*Worst case condition considered to be when the network under test is a differentiator. Also, an additional 20 db or so of attenuation at 19 kHz is provided by the slew rate limited amplifier A3 in FIG. 2. Amplifier A3 approximately converts the 1 kHz squarewave at the input to A3 into a triangle wave.
**Sampling rate as set in software programs.

The outputs of the filter bank are separately fed to a data acquisition system comprising an 8-channel differential analog multiplexer 96, an instrumentation amplifier 94 with programmable gain, a sample/hold circuit (not shown) and 12-bit A-D converter 92.

Under software control from the microcomputer 80, the data acquisition system 90 can select an analog input source from either of lines 120, 118, 116 or 114 and amplify either by 1, 10, 100 or 500. The selected analog input source, in addition to being amplified, is digitized by an A-D converter 92 at a reasonable high rate. The digitizing rate is an integer submultiple of $F_{REF}$, as adjusted, for each test frequency under software control via the STC board counters.

A strobe pulse on line 130 from system timing controller 60 is used to trigger the A-D conversion process. When the conversion process ends, the 12-bit digital output of the A-D converter 92 is coupled over bus 132 to the microcomputer where it is written into memory under software control.

Before the gain of the instrumentation amplifier 94 is set greater than unity, the DC offset present at the selected channel must be compensated. This is to prevent any residual DC offset present in the system from being amplified by the 1, 10, 100 or 500 inst. amp. gain which would possibly cause the inst. amp. to saturate or "clip" the input.

This is accomplished under software control utilizing the 12-bit digital-to-analog board 70 to prevent saturation of the instrumentation amplifier 94 or A-D converter 92. The computer 80 calculates the offset present in the signal from the A-D output. It then loads the D-A converter 70 with the appropriate number, the analog output of which compensates the selected input, via line 134 to the analog multiplexer 96.

Timing is controlled by the system timing controller 60 which comprises four 16-bit general purpose counters under software control from the microcomputer 80, as previously described.

Assuming that the computer has been given the command to take measurements, via the keyboard, the appropriate assembly level commands in the software set the counter C3 output in system timing controller 60. This signal on line 151 is coupled to the synchronization circuit 50 as an enable reset signal to enable the synchronization circuitry. At this point, the sensor system of FIG. 2 may be at any point within its measurement cycle and the 40 kHz $f_{REF}$ signal will not be present at the TTL output of the synchronization circuitry 50. The synchronization circuitry 50 will not time out until the $f_{REF}$ signal turns off for a few seconds. After the synchronization circuitry times out, then beginning with the first pulse after its 4-second OFF period, $f_{REF}$ will appear on line 156.

Starting with the first pulse after the 4 second disappearance, the 40 kHz signal at the RF amplifier output on line 150 will be gated to the synchronization circuitry's transistor-transistor-logic (TTL) output line 156.

This 40 kHz TTL output is applied to counters C1, C2 and C5 on line 156 with the count of C2 being read by the computer at appropriate times via bus 156. The computer 80 is thereby able to determine which of the four filter outputs to select and exactly when to begin sampling it. The sampling rate is 40 kHz divided by k, where k is a constant placed in counter C5 under software control. This allows k to be changed appropriately during the measurement cycle for each of the test frequencies applied by the sensor.

Figure 6:
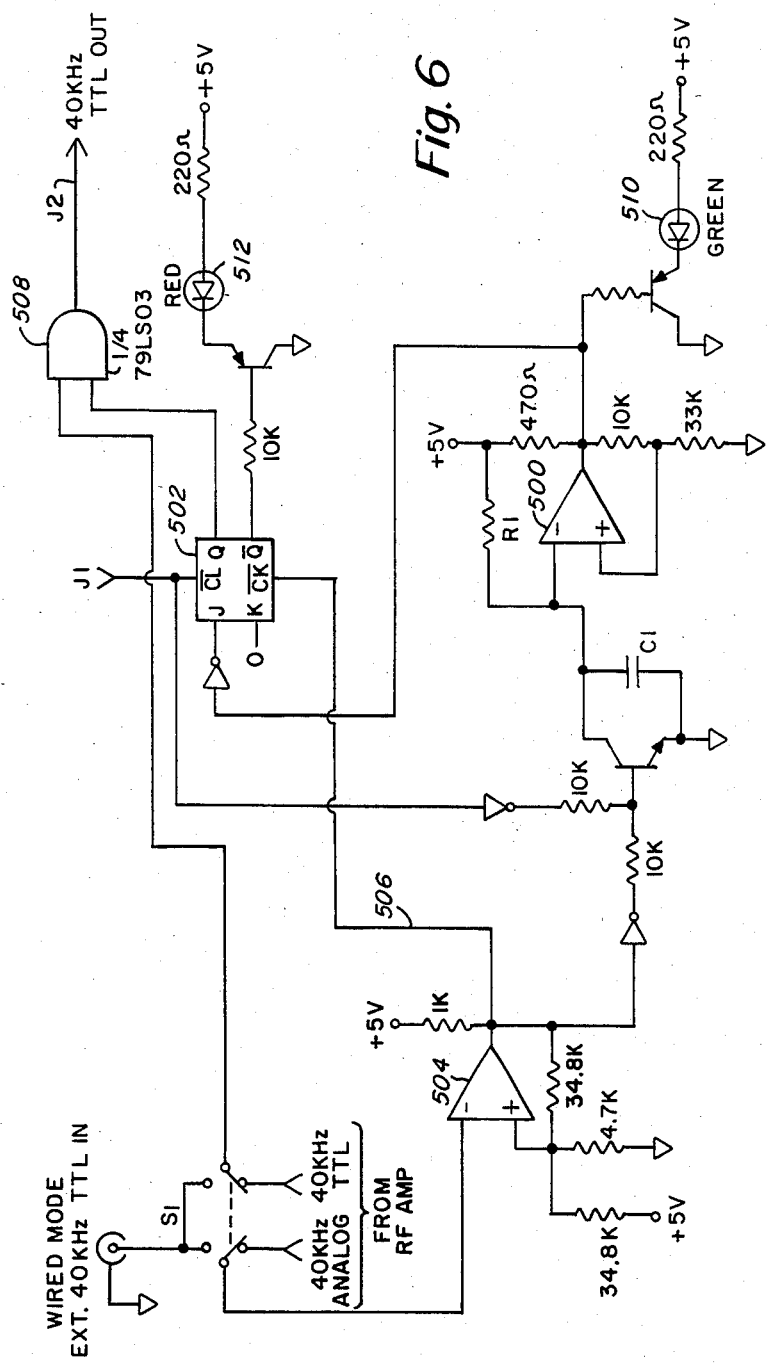
FIG. 6 is a schematic of the synchronization circuitry.

A schematic of the synchronization circuitry is shown in FIG. 6. A dual SPDT switch S1 allows the system to be used wirelessly or in a wired mode. If the enable reset signal at J1 is high and the 40 kHz signal disappears, C1 will charge up sufficiently to trip the comparator 500 and present a high logic level at the J-input of JK flipflop 502. The first 40 kHz pulse which comes through will set the flipflop 502 via the path through comparator 504 and line 506 to the $\overline{CK}$ input of flipflop 502. This allows the 40 kHz signal to be gated to the TTL output jack, J2, via AND gate 508.

When the measurement is over, the Enable-Reset signal at J1 is brought low which clears the flipflop 502, preventing any further signal at the TTL output jack, J2.

Green and red LED's 510 and 512, respectively, are provided to indicate disappearance and gating of the 40 kHz signal, respectively.

Figure 7:
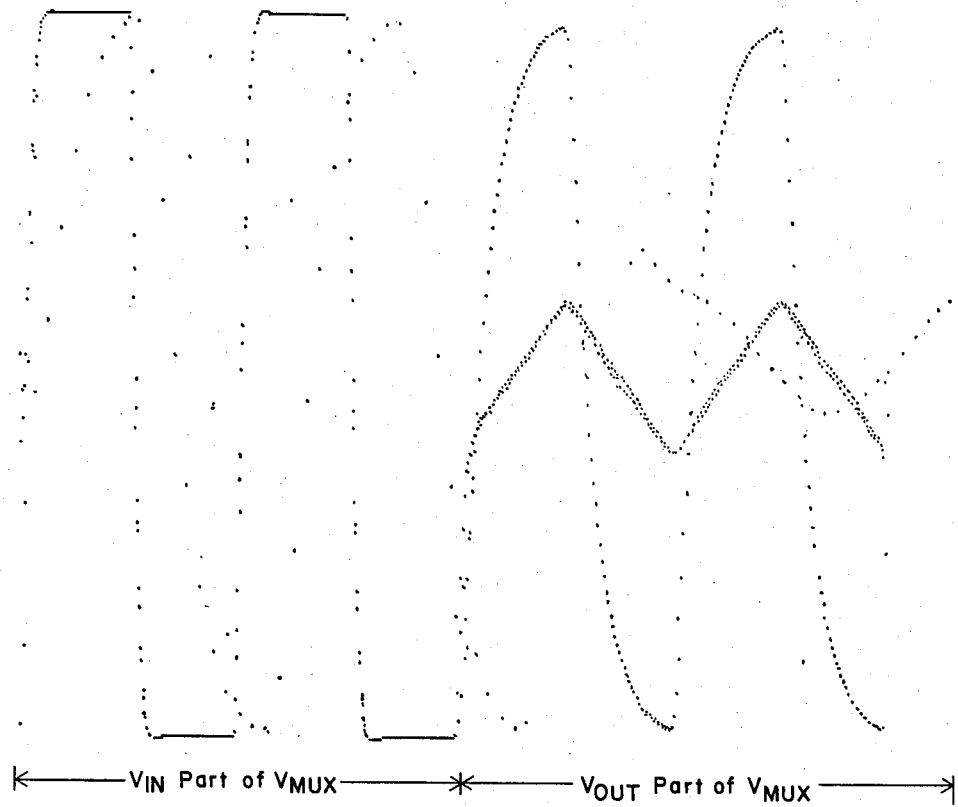
FIG. 7 is an illustration of a typical video display produced by a specific embodiment of the invention.

A plot of an actual video display, as it would be seen at the VDT 81, is shown in FIG. 7. FIG. 7 shows the signal $V_{MUX}$ after it has been digitized by the sample hold and A-D converter 92. All four test frequencies have been overlayed on top of each other in FIG. 6. At the top of FIG. 7, the relative gain and phase of $V_{OUT}$ vs. $V_{IN}$ at each of the four test frequencies is printed.

The Network Under Test 10, in this example, was a simple resistance-capacitive low pass filter. It should be noted that the relative gains and phases shown are at the fundamental of each test signal which were computed by the software which actually extracted the fundamental Fourier coefficient of the signals.

Note that in order to maintain accuracy, each signal is sampled at a rate which is an exact integral multiple of the fundamental frequency. This is the main reasoning behind generating the test frequencies by dividing the 40 kHz reference by the appropriate integers. While $V_{MUX}$ is applied to all of the inputs of the 4 filters, only the appropriate filter output is sampled for each of the four test frequencies.

Counters C1 and C2 in the system timing controller are cascaded to give a long 65K count length. They count the 40 kHz output at the synchronization circuit when it is enabled starting with the first pulse of $F_{REF}$ after the 4-second delay. After the measurements cycle starts, the assembly level subroutine software interrogates the count of cascaded counters C1 and C2 and waits for the appropriate count to begin sampling. Counter C3's output is forced high under software control after the system has been given a request to make a measurement. This, in turn, forces the enable-reset line of the synchronization circuit high allowing the synchronization circuit to detect the 4-second gap when it occurs.

Counter C5 is used to divide $F_{REF}$ by the appropriate integer k, which can be changed under software control. In this way, as the $F_{TEST}$ changes, the strobe frequency can also be changed to control the number of samples per cycle of $V_{MUX}$.

III. Software

A listing of the Assembly level and Fortran programs written for use with this system are given in Appendix A. These programs interface the computer 80 with the receiver circuitry. A more in-depth explanation of the software programs follows below. Reference to the programs listed in Appendix A will be necessary, in the following discussions. The subprograms will be explained first, followed by an explanation of the main Fortran program.

ASSEMBLY LEVEL SUBPROGRAMS

There are twelve assembly level subprograms that are used to interface the computer 80 to the STC 60, DAS 90, and D/A 70, and to plot the sampled waveforms.

Subprogram SINIT initializes the DAS 90 and STC 60. In particular, it programs counter C1 to divide the 40 kHz input by 40, producing a 1 kHz TTL signal at the input to counter C2. In addition, counter C2 is loaded with an initial value of 32767, and is programmed to count down. Thereby, the contents of counter C2 (after C2 is loaded and armed) indicate exactly where in the measurement cycle the system is. Before SINIT ends, it loads and arms counters C1, C2, and C3, which in turn produces a high logic level at EN/R (line 151).

Subprograms CHAN(x) is a short routine which sets the analog multiplexer 96 in the DAS 90 to channel x. DONE resets the STC 60 which in turn brings EN/R low, thereby disabling the 40 kHz TTL output from the synchronization circuitry 50. D2A(x), D2A1(x), D2A2(x), and D2A3(x) are routines which feed the integer x (−2048 to +2047) into the 12 bit D/A 70.

PINIT clears the video display 81 and homes the cursor. PLOT(x,y) is used to set a pixel at location x,y on the graphics screen of the VDT 81.

The subprograms SAMPL(w,x,y,AR), WAIT, and VAR function together to sample the present multiplexer channel according to the parameters w, x, and y, while AR is a one dimensional array which is to be filled with the samples. The calling Fortran program will operate on AR, after sampling is complete, to find the Fourier coefficients and relative gain-phase of the sampled signals and to demultiplex the signals. Variable "w" is the integer "K" that is loaded into counter C5, which thereby controls the four strobe sampling rates. The input signal periods are always sampled running the instrumentation amplifier 94 at unity gain. However, bits 10-11 (Gi) of variable x allow the gain to be set to 1, 10, 100, or 500 during the response signal periods of the multiplexed waveform. As the multiplexed signal changes from one input to its response to the next input, the amplifier gain of the instrument is correspondingly changed. Bits 12-14 of variable "x" (NCi/4), give information as to the total number of periods at the present test frequency which are to be sampled. Finally, variable "y" gives the count of counter C2 on which to start the sampling of the applied test frequency.

Fortran Subroutines

There are two Fortran subroutines called by the main program. The first subroutine is DCG(NC, NSC, NSCR, AR, AVG, DC, NTK, G). Its purpose is to calculate the DC offset and extrema, over one period of the response signal in the multiplexed waveform. After finding the extrema of the response signal, it calculates the proper instrumentation amplifier gain to use during the response signal periods of the multiplexed waveform. The appropriate gain bits are part of NTK which is passed back to the main program. NTK is the same as the variable x used in the subprogram SAMPL(w,x,y,AR) explained above. Also calculated by routine DCG for use by the main program, are AVG, DC, and G. AVG is the DC offset of the response signal, while DC is the appropriate integer which is to be fed into D/A 70 to compensate for the DC offset. G is the actual gain number (1, 10, or 100) corresponding to the gain bits of NTK. DCG is called after a "rough cut", consisting of a relatively few samples of the response signal, has been made. Variable NSCR is the number of samples per cycle taken for the rough cut, while array AR contains these samples.

The other subroutine used is DFS(AR, TR, NSC, G, M, P) which does calculations based on the variables AR, TR, NSC, and G, the results of the calculations being M and P. First routine DFS rearranges the array AR into two separate sequences, thus demultiplexing the input and response waveforms. This is accomplished by summing successive groups of four cycles (two cycles of input followed by two cycles of response) on top of the first group, thus forming an average group as the first four cycles in the array. The second and fourth cycles in the array thus formed, represent one period each of the (averaged) input and response waveforms. DFS then performs calculations on the second and fourth cycles in AR to find the relative gain and phase at their fundamental frequency, M being the relative gain in db, and P the relative phase in degrees. TR is an array formed from the appropriate values of a sinusoid, its entries used as necessary in the summation of equations. Routine DFS also plots the first four (averaged) cycles in AR on the video display.

Main Program

The main Fortran program consists primarily of CALL statements serving to connect the above subprograms in the desired sequence to make the measurements. The first part of this program defines various constants which control the hardware interface. What each constant controls is explained as follows:

NSCi: number of samples per cycle to be taken at test frequency $f=10^i$.

NCi: total number of cycles (at $f=10^i$) to be sampled.

Ni: is equal to the integer K used in counter C5 and causes the sampling rate for test frequency $f=10^i$ to be 40 kHz÷Ni.

In addition, constant C3=32767−2999 is the count of counter C2 at which to start sampling the 1 kHz signal for the rough cut. Since the 40 kHz reference is not transmitted during the first four seconds of application of the 1 kHz test frequency, C3 indicates that rough cut sampling will start on count 3000 (1 count=1 millisecond) which is seven seconds after the start of the 1 kHz signal application. Likewise, constant C31=32767−3971 will cause the sampling for the real data measurement at 1 kHz to start on count 3972 allowing the last 28 cycles of the 1 kHz test signal to be sampled. The other constants C2, C21, C1, C11, C0, C01 similarly control when the rough cut and real data sampling is to begin for the other three test frequencies. The time between rough cut sampling and real data sampling (being the difference between Ci and Ci1) is chosen to be long enough for the computer to do the intermediate calculations necessary (about 0.5 seconds). In addition, the chosen constants give 3-5 seconds for the relative gain-phase to be calculated and printed, before rough cut sampling of the next applied test frequency is required. This allows the same array, AR, to be filled over and over again with the rough cut and real data samples of all applied frequencies, thereby saving on memory space.

A measurement, as performed by the main program at one of the applied frequencies consists of steps outline in Part III above at page 22.

Equivalents

While the inventions have been particularly shown and described with reference to the preferred embodiments thereof, it will be understood by those skilled in the art that various changes in form and details may be made therein without departing from the spirit and scope of the inventions described in the appended claims.

APPENDIX A

```
type mp.for
C
C mp.for
C Robert K. Schweickert   ©1984
C
C Program to sample VDG,VFG and calculate the Magnitude and Phase of VFG/VDG
C
```

```
C This program CALLS dfs.for, dcg.for, samp.mac
C
        REAL TPI,TR0(251),TR1(251),TR2(51),TR3(6),M,P
        INTEGER AR(4000),C0,C1,C2,C3,C01,C11,C21,C31,DC,G
        BYTE X
        CALL PINIT
        CALL D2A(0)
        CALL D2A1(0)
        CALL D2A2(0)
        CALL D2A3(0)
C
C Parameters:
C NSCi is the # of samples per cycle at freq=10**i. NSCi must be divisible
C by 4 with (2*NSCi)<1021.
C The sample rate at freq=10**i is CLOCK/Ni with Ni> or = to 2. (CLOCK=40kHz
C max). If NSCi is changed, Ni must correspondingly be changed.
C The total # of samples to be taken at freq=10**i is (NSCi*NCi).
C NCi is the total # of cycles to be sampled at freq=10**i and must be
C divisible by 4 with NCi< or = to 28.
C Ci is counter 2's count at which to start sampling at freq=10**i. Counters
C 1 and 2 are concatenated and will count the 40kHz CLOCK output from my
C signal processing hardware.
C
        NSC0=400
        NC0=8
        N0=100
C
        NSC1=400
        NC1=8
        N1=10
C
        NSC2=200
        NC2=20
        N2=2
C
        NSC3=20
        NC3=28
        N3=2
C
C Counter #2 counts after which to start sampling for the rough cut and
C for the real data for each frequency. (1 count =1 millisecond for
C CLOCK=40kHz)
C
        C3=32767-2999
        C31=32767-3971
C
        C2=32767-10999
        C21=32767-11799
C
        C1=32767-18399
        C11=32767-19199
C
        C0=32767-23999
C
C Start sampling the 1Hz signal a couple of milliseconds early to make
C sure last sample is taken before the synchronization period (the 40kHz
C CLOCK will shut off for 4 seconds at the begining of a complete
C measurement cycle). This results in the following value for C01.
C
        C01=32767-27997
C
C Generate quarter sinusoid array for each frequency
C
        TPI=2*3.141592654
        TPIN=TPI/NSC0
        J=NSC0/4
        DO 100 I=0,J
        TR0(I+1)=SIN(I*TPIN)
100     CONTINUE
        TPIN=TPI/NSC1
        J=NSC1/4
```

```
              DO 120 I=0,J
              TR1(I+1)=SIN(I*TPIN)
120           CONTINUE
              TPIN=TPI/NSC2
              J=NSC2/4
              DO 130 I=0,J
              TR2(I+1)=SIN(I*TPIN)
130           CONTINUE
              TPIN=TPI/NSC3
              J=NSC3/4
              DO 140 I=0,J
              TR3(I+1)=SIN(I*TPIN)
140           CONTINUE
C
C Wait for request to measure. CTRL-C =STOP, anything else = start
C measurement.
C
110           READ (1,10) X
10            FORMAT (A1)
              IF (X .EQ. 3) STOP
C
C At 1kHz, do rough cut checking for gain and offset compensation.
C
              CALL SINIT
              CALL CHAN(3)
              CALL D2A(0)
              CALL SAMPL(N3,(7*(NSC3/4)+4096),C3,AR)
              CALL DCG(NC3,NSC3,NSC3,AR,AVG,DC,NT00,G)
C
C Sample signal for real 1kHz data, plot it, and calculate relative
C gain and phase.
C
              CALL D2A(DC)
              CALL SAMPL(N3,NT00,C31,AR)
              CALL D2A(0)
              CALL DFS(AR,TR3,NSC3,NC3,G,M,P)
C
C Compensate for phase shift thru instrumentation amplifier at 1kHz.
C
              IF (G .EQ. 1) P=P+0
              IF (G .EQ. 10) P=P+0.35
              IF (G .EQ. 100) P=P+1.47
              WRITE (1,20) M,P,AVG,G
20            FORMAT (' At 1kHz   Mag(dbV)=',F8.3,' Phase=',F8.3,' Offset=',F6
     H        .3,' Gain=',I3)
C
C At 100Hz, do rough cut checking for gain and offset compensation. For
C the rough cut use only 100 samples/cycle to give plenty of time before
C sampling the real data.
C
              CALL CHAN(2)
              CALL SAMPL(4,(7*(100/4)+4096),C2,AR)
              CALL DCG(NC2,NSC2,100,AR,AVG,DC,NT00,G)
C
C Sample signal for real 100Hz data, plot it, and calculate relative
C gain and phase.
C
              CALL D2A(DC)
              CALL SAMPL(N2,NT00,C21,AR)
              CALL D2A(0)
              CALL DFS(AR,TR2,NSC2,NC2,G,M,P)
C
C Compensate for inst. amp.'s phase shift at 100Hz.
C
              IF (G .EQ. 10) P=P+0.035
              IF (G .EQ. 100) P=P+0.15
              WRITE (1,30) M,P,AVG,G
30            FORMAT (' At 100Hz  Mag(dbV)=',F8.3,' Phase=',F8.3,' Offset=',F6
     H        .3,' Gain=',I3)
C
C Do rough cut at 10Hz, again using only 100 samples/cycle.
C
```

```
        CALL CHAN(1)
        CALL SAMPL(40,(7*(100/4)+4096),C1,AR)
        CALL DCG(NC1,NSC1,100,AR,AVG,DC,NT00,G)
C
C Sample signal for real 10Hz data.
C
        CALL D2A(DC)
        CALL SAMPL(N1,NT00,C11,AR)
        CALL D2A(0)
        CALL DFS(AR,TR1,NSC1,NC1,G,M,P)
C
C Compensate for inst. amp.'s phase shift at 10Hz.
C
        IF (G .EQ. 100) P=P+0.01
        WRITE (1,40) M,P,AVG,G
40      FORMAT (' At 10Hz    Mag(dbV)=',F8.3,' Phase=',F8.3,' Offset=',F6
     H  .3,' Gain=',I3)
C
C Do rough cut at 1Hz using only 100 samples/cycles.
C
        CALL CHAN(0)
        CALL SAMPL(400,(7*(100/4)+4096),C0,AR)
        CALL DCG(NC0,NSC0,100,AR,AVG,DC,NT00,G)
C
C Sample signal for real 1Hz data.
C
        CALL D2A(DC)
        CALL SAMPL(N0,NT00,C01,AR)
        CALL DONE
        CALL D2A(0)
        CALL DFS(AR,TR0,NSC0,NC0,G,M,P)
        WRITE (1,50) M,P,AVG,G
50      FORMAT (' At 1Hz     Mag(dbV)=',F8.3,' Phase=',F8.3,' Offset=',F6
     H  .3,' Gain=',I3)
C
C Loop for next group of measurements
C
        GOTO 110
        END
A>^Ctype dcg.for
C
C dcg.for
C Robert K. Schweickert July 1,1983
C
C Subroutine called by mp.for to calculate signal average (DC offset)
C and the maximum appropriate gain to use when sampling 'VFG'.
C
        SUBROUTINE DCG(NC,NSC,NSCR,AR,AVG,DC,NTK,G)
        INTEGER AR(4000),G,DC,SIZE
        NTK=2*NSC+4096*(NC/4)
        K2=5*(NSCR/2)
        AVG=0
        MX=AR(K2+1)
        MN=MX
C
C Find average and extrema of signal over one cycle of 'VFG'.
C
        DO 500 I=1,NSCR
        J0=K2+I
        AVG=AVG+AR(J0)
        MX=MAX0(MX,AR(J0))
        MN=MIN0(MN,AR(J0))
500     CONTINUE
        AVG=AVG/NSCR
C
C Get integer representation of offset (DC) to be used as a D/A input
C to compensate offset.
C
        DC=IFIX(AVG)
        AVG=AVG/204.8
C
```

```
C Set gain number dependent on extrema of 'VFG'. G will be used as
C the instrumentation amplifier's gain when 'VFG' is applied.
C
        SIZE=MX-MN
        G=0
        IF (SIZE .LT. (409.6-1)) G=1
        IF (SIZE .LT. (40.96-1)) G=2
        NTK=NTK+1024*G
        G=10**G
        RETURN
        END
A>^Ctype dfs.for
C
C dfs.for
C Robert K. Schweickert  July 1,1983
C
C Subroutine called by mp.for to plot the sampled signals, and to
C calculate the complex Discrete Fourier Series coefficient of the
C fundamental of each signal. This subroutine will return the relative
C Gain and Phase of the two signals.
C
        SUBROUTINE DFS(ARRAY,TRIG,NSCYC,NC,GAIN,MAG,PHASE)
        REAL A1,B1,A2,B2,MAG,PHASE,TRIG(251)
        INTEGER ARRAY(4000),NSCYC,GAIN
C
C Sum successive groups of 4 cycles on top of the first group of 4
C cycles in the array. This results in 2 cycles of 'VDG' followed by
C 2 cycles 'VFG' summed appropriately on top of each other as the first
C 4 cycles in the array.
C
        J=4*NSCYC
        M=NSCYC*NC-J
        DO 300 K=J,M,J
        DO 200 I=1,J
        JO=I+K
        ARRAY(I)=ARRAY(I)+ARRAY(JO)
200     CONTINUE
300     CONTINUE
C
C Plot the averaged 2 cycles 'VDG' followed by the averaged 2 cycles 'VFG'
C
        IF (J .LT. 476) GOTO 100
        JO=(J/476)+1
        N=NC/4
        L=0
        DO 410 I=0,J,JO
        CALL PLOT(L,ARRAY(I+1)/(10*N)+240)
        L=L+1
410     CONTINUE
        GOTO 150
100     JO=(476/J)+1
        N=NC/4
        L=0
        DO 400 I=0,476,JO
        L=L+1
        CALL PLOT(I,ARRAY(L)/(10*N)+240)
400     CONTINUE
C
C Calculate DFS coefficient of fundamental using only the first quarter
C sinusoid in the correlation.
C
150     A1=0
        B1=0
        A2=0
        B2=0
        L=(3*(NSCYC/4))+2
        K2=2*NSCYC
        K3=3*NSCYC
        J=(NSCYC/4)+2
        K=J-2
        DO 700 I=1,K
        LO=I+L
```

```
              B1=B1+ARRAY(L0)*TRIG(I)
              J0=I+K2+L
              B2=B2+ARRAY(J0)*TRIG(I)
              J1=J-I
              A1=A1+ARRAY(L0)*TRIG(J1)
              A2=A2+ARRAY(J0)*TRIG(J1)
700           CONTINUE
              DO 800 I=1,K
              K1=I+K+K2+L
              J0=I+K+L
              J1=J-I
              B1=B1+ARRAY(J0)*TRIG(J1)
              B2=B2+ARRAY(K1)*TRIG(J1)
              A1=A1-ARRAY(J0)*TRIG(I)
              A2=A2-ARRAY(K1)*TRIG(I)
800           CONTINUE
              K0=2*K
              DO 900 I=1,K
              K1=I+K0+K2+L
              J0=I+K0+L
              J1=J-I
              B1=B1-ARRAY(J0)*TRIG(I)
              B2=B2-ARRAY(K1)*TRIG(I)
              A1=A1-ARRAY(J0)*TRIG(J1)
              A2=A2-ARRAY(K1)*TRIG(J1)
900           CONTINUE
              K0=3*K
              DO 910 I=1,K
              K1=I+K0+K2+L
              J0=I+K0+L
              J1=J-I
              B1=B1-ARRAY(J0)*TRIG(J1)
              B2=B2-ARRAY(K1)*TRIG(J1)
              A1=A1+ARRAY(J0)*TRIG(I)
              A2=A2+ARRAY(K1)*TRIG(I)
910           CONTINUE
C
C Find Magnitude (db) and Phase (degrees) of transfer function VFG/VDG.
C
              VDG=SQRT(A1*A1+B1*B1)
              VFG=SQRT(A2*A2+B2*B2)
              MAG=VFG/(VDG*GAIN)
              IF (MAG .LE. 1E-5) GOTO 920
              MAG=20*ALOG10(MAG)
              PHASE=(ATAN2(A2,B2)-ATAN2(A1,B1))*180/3.141592654
              IF (PHASE .GT. 180) PHASE=PHASE-360
              IF (PHASE .LT. -180) PHASE=PHASE+360
              GOTO 930
C
C Fix values in case of underflow and print
C
920           MAG=-100
              PHASE=0
930           RETURN
              END
A>type samp.mac
; samp.mac
; Robert K. Schweickert   July 1,1983

; These subprograms are called by mp.for to interface with my signal
; processing hardware.

; Subprograms:
;       SINIT --Initializes the A/D and system timing controller to
;               interface with my hardware.
;       CHAN----Sets multiplexer to the channel # passed to it.
;       SAMPL---Samples multiplexer channel #0 according to the
;               parameters fed to it.
;       WAIT----The actual sampling routine called by SAMPL. WAIT can
;               change the inst. amp.'s gain after every two cycles.
;       DONE----Resets my hardware and the system timing controller
;               after each complete measurement cycle.
```

```
;       D2A,D2A1,D2A2,D2A3------Set the appropriate D/A converter's
;                      output to the voltage corresponding to its integer
;                      input.
;              VAR-----Called by SAMPL to put the calling FORTRAN program's
;                      variables in the appropriate registers.
;              PINIT---Clears screen and homes cursor.
;              PLOT----Sets pixel at location x,y on graphics screen.

; Hardware connections:
;              Connector P3;
; EXT. STROBE (pin 3) connect to OUT5 (pin4)
; SRC5 (pin 14) connect to 40kHz external CLOCK
; OUT3 (pin 6) connect to external ENABLE/RESET
; Digital Ground (pin 21-40)
;              Connector P1D (analog input P1):
; Diff. input Channel #0 HI (pin 20) connect to the 1Hz Bessel filter
; output.
; Diff. input Channel #1 HI (pin 18) connect to the 10Hz Bessel filter
; output.
; Diff. input Channel #2 HI (pin 16) connect to the 100Hz Bessel filter
; output.
; Diff. input Channel #3 HI (pin 14) connect to the 1kHz Bessel filter
; output.
; Diff. input Channel 0,1,2,3 Lo (pins 19,17,15,13) connect
; to D/A channel #0 output (pin #1 on the D/A board)
; Analog Ground (pin 1-4,21-40) and pin #2 on the D/A board ; Constants:

CMD     EQU    10H
        STAT    EQU    10H
        MUX     EQU    12H
        ADLOW   EQU    12H
        CVRT    EQU    14H
        ADHIGH  EQU    14H
        D9513   EQU    1CH
        C9513   EQU    1EH

; PROGRAM BEGINS:

ENTRY   SINIT

SINIT:  MVI     A,0FFH  ;Master reset of STC
        OUT     C9513
        MVI     A,5FH   ;Clear all counters in TC
        OUT     C9513
        MVI     A,05H   ;Point to counter 5 mode register
        OUT     C9513   ;element cycle increment
        MVI     A,21H   ;Mode D, count SRC5, Active HI TC, count down
        OUT     D9513
        MVI     A,15H
        OUT     D9513
        MVI     A,01H   ;Point to C1 mode register
        OUT     C9513   ;Element cycle increment
        MVI     A,21H   ;Mode D, count SRC5, Active HI TC, count down,
        OUT     D9513   ;count on falling edge
        MVI     A,15H
        OUT     D9513
        MVI     A,28H   ;Load C1 load register with 40 so that
        OUT     D9513   ;OUT1=CLOCK/40
        MVI     A,00H
        OUT     D9513
        MVI     A,02H   ;Point to C2 mode register
        OUT     C9513   ;element cycle increment
        MVI     A,01H   ;Count TC1 on falling edge, no gating, count
        OUT     D9513   ;once, binary count, count down, active high TC
        MVI     A,10H
        OUT     D9513
        MVI     A,0FFH  ;Load C2 load reg. with 32767
        OUT     D9513
        MVI     A,7FH
```

```
        OUT     D9513
        MVI     A,0CH       ;Set Gain=1, external strobe, load enable
        OUT     CMD
        MVI     A,03H       ;Point to C3 mode register
        OUT     C9513
        MVI     A,21H       ;Mode D, count SRC F1, active HI TC, count down
        OUT     D9513
        MVI     A,1BH
        OUT     D9513
        MVI     A,01H       ;Load C3 load reg. with 1
        OUT     D9513       ;Once loaded and armed, OUT3 will go HI and stay HI
        MVI     A,00H
        OUT     D9513
        MVI     A,67H       ;Load and arm C1,C2,C3
        OUT     C9513
        IN      ADHIGH      ;Clear DONE bit on A/D
        RET                 ;RETURN to FORTRAN ;Input Parameters
;       Multiplexer channel #           HL ptr.

ENTRY   CHAN

CHAN:   MOV     A,M         ;get channel #
        OUT     MUX         ;set MUX to that channel #
        RET ;Input Parameters
;       Sample every N CLOCK Pulses     HL ptr.
;       2*NSCi+1024*Gi+4096*(NCi/4)     DE ptr.
;       Count on which to start (C)     BC ptr. to ptr.
;       Array to fill (AR)              BC ptr. to ptr.

ENTRY   SAMPL

SAMPL:  CALL    VAR         ;Load C5 with N, put 2*NSCi in DE, put C in BC,
                            ;and ptr. to AR in HL
        DCX     SP          ;Make SP point to var. 2
        DCX     SP
        DCX     SP
        DCX     SP
SAVE:   MVI     A,0A2H      ;Save C2 contents in HOLD register
        OUT     C9513
        MVI     A,12H       ;Point to C2 HOLD register and initiate prefetch
        OUT     C9513
        IN      D9513       ;Input low order byte
        SUB     C
        IN      D9513       ;Input high order byte
        SBB     B
        JNC     SAVE        ;Jump to SAVE until count is less than C
        POP     B           ;Put var. 2 into BC
        INX     SP          ;Restore SP
        INX     SP
        MVI     A,70H       ;Load and arm C5
        OUT     C9513
        IN      ADHIGH      ;Clear DONE bit on A/D
        CALL    WAIT        ;Fill AR with samples
        RET                 ;RETURN to FORTRAN

ENTRY   VAR

VAR:    MVI     A,0DH       ;Point to C5 load reg.
        OUT     C9513
        MOV     A,M
        OUT     D9513
        INX     H
        MOV     A,M
        OUT     D9513       ;Now OUT5=SRC5/N
        XCHG                ;Now HL has ptr. to variable 2
        MOV     E,M
```

```
            INX      H
            MOV      D,M         ;Now DE has variable 2
            PUSH     D           ;Store var 2 on stack
            MVI      A,03H       ;Mask out bits 9,10 of 2*NSCi
            ANA      D
            MOV      D,A         ;Now DE contains 2*NSCi
            MOV      L,C         ;BC has ptr. to ptr. to C
            MOV      H,B         ;Now HL has ptr. to ptr. to C
            MOV      C,M
            INX      H
            MOV      B,M
            INX      H           ;Now BC has ptr. to C
            PUSH     H           ;Put ptr. to ptr. on stack
            MOV      L,C
            MOV      H,B         ;Now HL has ptr. to C
            MOV      C,M
            INX      H
            MOV      B,M         ;Now BC has variable C
            PUSH     D           ;Store 2*NSCi on stack
            INX      SP
            INX      SP
            POP      H           ;pop ptr. to ptr. to AR
            MOV      E,M
            INX      H
            MOV      D,M         ;Now DE has ptr. to AR
            PUSH     H
            DCX      SP
            DCX      SP
            XCHG                 ;Now HL has ptr. to AR
            POP      D           ;and DE has 2*NSCi, BC has C
            INX      SP
            INX      SP          ;Put SP back to same number as at call
            INX      SP
            INX      SP
            RET ENTRY    WAIT
WAIT:       IN       STAT        ;Wait until conversion complete
            ORA      A
            JP       WAIT
            IN       ADLOW
            MOV      M,A         ;Store low order byte first
            IN       ADHIGH
            INX      H
            MOV      M,A         ;Store high order byte
            INX      H
            DCX      D
            MOV      A,D
            ORA      E
            JNZ      WAIT MVI      A,0CH       ;Mask out gain bits
            ANA      B
            RRC
            RRC                  ;Position gain bits
            ORI      0CH         ;Set gain, ext. strobe,load enable
            OUT      CMD MVI      A,03H       ;Mask out bits 9,10 of 2*NSCi
            ANA      B
            MOV      D,A         ;Put 2*NSCi into DE
            MOV      E,C WAIT2:      IN       STAT
            ORA      A
            JP       WAIT2
            IN       ADLOW
            MOV      M,A
            IN       ADHIGH
            INX      H
            MOV      M,A
            INX      H
```

```
            DCX     D
            MOV     A,D
            ORA     E
            JNZ     WAIT2

MVI     A,0CH     ;Set gain back to 1
            OUT     CMD
            MVI     A,03H     ;Mask out bits 9,10 of 2*NSCi and put it into DE
            ANA     B
            MOV     D,A
            MOV     E,C
            MOV     A,B
            SUI     10H
            MOV     B,A
            ANI     0F0H      ;Mask out whats left of (NCi/4)
            JNZ     WAIT
            MVI     A,0D0H    ;Disarm C5
            OUT     C9513
            MVI     A,50H     ;Clear C5 if in TC (load C5)
            OUT     C9513
            RET

ENTRY   DONE

DONE:       MVI     A,0FFH    ;Master reset of STC
            OUT     C9513
            MVI     A,5FH     ;Clear all counters in TC
            OUT     C9513     ;This should bring ENABLE/RESET low
            RET ;           FINIT   (Subprogram)    ;clear screen, home cursor
;           PLOT    (Subprogram)    ;set pixel at location x,y on screen ; Programs begin:

ENTRY   FINIT

FINIT:      MVI     C,0CH     ;Clear screen
            CALL    0F80CH
            MVI     C,81H     ;Home cursor
            CALL    0F80CH
            MVI     C,0
            CALL    0F80CH
            MVI     C,0
            CALL    0F80CH
            RET

ENTRY   PLOT

PLOT:       MVI     C,8DH
            CALL    0F80CH
            INX     H
            MOV     C,M
            CALL    0F80CH
            DCX     H
            MOV     C,M
            CALL    0F80CH
            XCHG
            INX     H
            MOV     C,M
            CALL    0F80CH
            DCX     H
            MOV     C,M
            CALL    0F80CH
            RET
```

;This routine will set the D/A channel #0 output to the voltage
;corresponding to its (numerical) input.

;Input Parameters:
;       Voltage # (-2048 to +2047)     HL ptr.

```
;Constants:

D2A0HI  EQU     08H
        D2A0LO  EQU     09H

;Program begins:

ENTRY   D2A

D2A:    INX     H       ;put D/A code into channel #0
        MOV     A,M     ;get high byte first
        OUT     D2A0HI
        DCX     H
        MOV     A,M
        OUT     D2A0LO
        RET
;Input parameters:
;       Voltage # (-2048 to +2047)      HL ptr.

;Constants:

D2A1HI  EQU     0AH
        D2A1LO  EQU     0BH
        D2A2HI  EQU     0CH
        D2A2LO  EQU     0DH
        D2A3HI  EQU     0EH
        D2A3LO  EQU     0FH

;Programs begin:

ENTRY   D2A1

D2A1:   INX     H       ;THIS IS THE SAME AS ABOVE
        MOV     A,M
        OUT     D2A1HI
        DCX     H
        MOV     A,M
        OUT     D2A1LO
        RET

ENTRY   D2A2

D2A2:   INX     H
        MOV     A,M
        OUT     D2A2HI
        DCX     H
        MOV     A,M
        OUT     D2A2LO
        RET

ENTRY   D2A3

D2A3:   INX     H
        MOV     A,M
        OUT     D2A3HI
        DCX     H
        MOV     A,M
        OUT     D2A3LO
        RET
```

I claim:
1. Apparatus for determining the relative gain and phase of two analog input electrical signals comprising:
   (a) multiplexing means for time-division multiplexing the two analog signals at a predetermined rate;
   (b) converter means for converting the multiplexed analog signals to digital signals;
   (c) storage means for storing said digital signals;
   (d) processor means for demultiplexing the stored digital signals at said predetermined rate and for reconstructing such signals into two separate digital signals corresponding to the two separate analog input signals.

2. The apparatus of claim 1 wherein the spectral components of the two analog input signals are determined by calculating the Fourier Series coefficients of the stored digital signals.

3. The apparatus of claim 1 wherein the sampling rate is an integral multiple of the fundamental frequency of the analog input signals.

4. Apparatus for measuring the relative gain and phase of two analog electrical signals comprising:

(a) multiplexing means for time-division multiplexing the two analog signals at a predetermined rate;

(b) a frequency source for generating a frequency signal which is an even integer multiple or submultiple of the fundamental frequency of one of the analog signals, said frequency signal controlling the predetermined multiplexing rate of the multiplexing means;

(c) converter means for converting the multiplexed analog signals to digital signals;

(d) sampling means for controlling the rate of converting of the converter means so that an integral multiple or submultiple of the frequency of one of the analog signals is converted per cycle of both analog signals;

(e) synchronizing means to enable the sampling means to commence sampling after a predetermined interval;

(f) storage means for storing said digital signals;

(g) processor means for demultiplexing the stored digital signals at said predetermined rate and for reconstructing such signals into two separate digital signals corresponding to the two separate analog input signals.

5. The apparatus of claim 4 including filter means for reducing the amplitude of higher order harmonics in the multiplexed analog signals prior to conversion to digital signals to prevent ambiguity errors.

6. The apparatus of claim 4 including spectral analysis means for determining the relative gain and phase of the digital signals stored in memory.

7. The apparatus of claim 6 wherein the relative gain and phase is determined at a plurality of frequencies.

8. The apparatus of claim 7 wherein the frequencies extend over four decades.

9. The apparatus of claim 4 wherein the two analog signals are the input and output signals of a device under test.

10. The apparatus of claim 9 wherein the device under test is a microdielectrometer.

* * * * *